US008638559B2

(12) United States Patent
Barina et al.

(10) Patent No.: US 8,638,559 B2
(45) Date of Patent: Jan. 28, 2014

(54) USER-SERVICEABLE LIQUID DIMM COOLING SYSTEM

(75) Inventors: Richard M. Barina, Sebring, FL (US); Vinod Kamath, Raleigh, NC (US); Chunjian Ni, Cary, NC (US); Derek I. Schmidt, Raleigh, NC (US); Mark E. Steinke, Durham, NC (US); James S. Womble, Hillsborough, NC (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 13/293,174

(22) Filed: Nov. 10, 2011

(65) Prior Publication Data

US 2013/0120926 A1 May 16, 2013

(51) Int. Cl.
*H05K 7/20* (2006.01)
(52) U.S. Cl.
USPC ............ 361/704; 361/679.52; 361/679.53; 361/679.54; 361/699; 361/700; 165/80.4; 165/80.5; 165/104.21; 165/104.26; 165/104.33
(58) Field of Classification Search
USPC .......... 361/679.46, 679.52, 679.54, 688, 689, 361/698–702, 704–712, 715, 717–727; 165/80.2–80.5, 104.14, 104.21, 165/104.26, 104.33, 185; 174/15.1, 16.3, 174/252; 257/706–727; 62/259.2
See application file for complete search history.

(56) References Cited

U.S. PATENT DOCUMENTS

| 4,479,140 | A | 10/1984 | Horvath |
| 5,966,287 | A | 10/1999 | Lofland et al. |
| 7,151,668 | B1 * | 12/2006 | Stathakis ................. 361/700 |
| 7,391,613 | B2 * | 6/2008 | Lai et al. ................. 361/700 |
| 7,408,776 | B2 | 8/2008 | Campbell et al. |
| 7,639,498 | B2 | 12/2009 | Campbell et al. |
| 7,855,888 | B2 * | 12/2010 | Peterson ................. 361/699 |
| 7,907,398 | B2 | 3/2011 | Hrehor, Jr. et al. |
| 7,957,134 | B2 * | 6/2011 | Farnsworth et al. ..... 361/679.54 |
| 7,990,699 | B2 * | 8/2011 | Lian et al. ............... 361/679.47 |

(Continued)

FOREIGN PATENT DOCUMENTS

| JP | 2009230505 | 10/2009 |
| WO | WO2011053307 A | 5/2011 |
| WO | WO2011053310 A | 5/2011 |
| WO | WO2011053310 A1 | 5/2011 |
| WO | WO2011053313 A | 5/2011 |

OTHER PUBLICATIONS

UK Intellectual Property Office, "International Business Machines Corporation" Application No. GB1218540.1, Letter of reply to examination with attachment, Jun. 3, 2013, 2 pages.

(Continued)

*Primary Examiner* — Michail V Datskovskiy
(74) *Attorney, Agent, or Firm* — Cynthia G. Seal; Jeffrey L. Streets

(57) ABSTRACT

A cooling system for a memory module comprises a heat conduction assembly for conducting heat from the memory module to liquid-cooled mounting blocks. In one embodiment, each heat conduction assembly includes a frame having opposing first and second supports, first and second heat spreader plates each extending from the first support to the second support, and a pair of flattened heat pipes each extending along a respective one of the heat spreader plates from the first support to the second support. The liquid-cooled mounting blocks releasably support the heat conduction assembly over a memory module socket with the memory module between the heat spreader plates.

19 Claims, 4 Drawing Sheets

(56) References Cited

U.S. PATENT DOCUMENTS

| | | | |
|---|---|---|---|
| 8,004,841 B2 * | 8/2011 | Cipolla et al. | 361/699 |
| 8,027,162 B2 * | 9/2011 | Campbell et al. | 361/699 |
| 8,081,473 B2 * | 12/2011 | Cipolla et al. | 361/719 |
| 8,238,101 B2 * | 8/2012 | Kalms et al. | 361/700 |
| 8,385,067 B2 * | 2/2013 | Arvelo et al. | 361/699 |
| 8,493,738 B2 * | 7/2013 | Chainer et al. | 361/700 |
| 2006/0250772 A1 | 11/2006 | Salmonson et al. | |
| 2007/0263361 A1 | 11/2007 | Lai et al. | |
| 2008/0062652 A1 | 3/2008 | Lieberman et al. | |
| 2008/0192428 A1 | 8/2008 | Clayton et al. | |
| 2009/0277616 A1 | 11/2009 | Cipolla et al. | |
| 2010/0025010 A1 | 2/2010 | Cipolla et al. | |
| 2010/0085712 A1 | 4/2010 | Hrehor, Jr. et al. | |
| 2010/0252234 A1 | 10/2010 | Cambell et al. | |
| 2011/0149505 A1 | 6/2011 | Goth et al. | |
| 2011/0209855 A1 * | 9/2011 | Peterson et al. | 165/104.26 |
| 2012/0020022 A1 * | 1/2012 | Peterson et al. | 361/699 |

OTHER PUBLICATIONS

Intellectual Property Office, "Combined Search and Examination Report" Application No. GB1218540.1, Mar. 1, 2013, 8 pages.

Ip.com Technical Disclosure, "DIMM Array Liquid Cooling Structure With FRU-ability Features", IP.com No. IPCOM000168297D, Mar. 5, 2008, 3 pages.

Ip.com Technical Disclosure, "Energy Efficient Server Design using isolated air and liquid cooling", IP.com No. IPCOM000189089D, Oct. 27, 2009, 3 pages.

Ip.com Technical Disclosure, "Method for low-cost memory cooling", IP.com No. IPCOM000137893D, Jun. 29, 2006, 7 pages.

Fujitsu Ltd, "Board Unit and Electronic Apparatus", JP200923050A English translation, JP2009230505_translation.doc, Oct. 8, 2009, pp. 1-6.

* cited by examiner

USER-SERVICEABLE LIQUID DIMM COOLING SYSTEM

BACKGROUND

1. Field of the Invention

The present invention relates generally to cooling computer systems, and more particularly to liquid-cooling computer memory modules.

2. Background of the Related Art

Computer systems generate heat in relation to their power consumption. System components contribute in various amounts to the total heat production of a computer system. While processors are generally the hottest-running components, system memory can consume a significant percentage of the total system power and generate a corresponding amount of heat. In a server, for instance, memory modules may be responsible for as much as 50% of the total heat load. Increasingly powerful component configurations are also being developed for use in pre-defined dimensional constraints. For example, server systems often must conform to existing, standardized server chassis dimensions, while other computer systems are becoming more compact. The increased component and thermal densities present significant cooling demands and challenges.

Cooling systems are used to maintain system components within prescribed temperature limits for operational reliability and safety. Large computer systems, such as in data centers, typically have a rack-mounted, modular construction. Traditionally, servers and other rack-mounted equipment have been cooled by forced-convection cooling using air moving devices, such as fans and blowers. These air moving devices are often designed to displace hot air away from the components by creating parallel air flow paths that circulate through the chassis and rack. Air moving systems may take the form of a computer room air conditioning (CRAC) system, a chassis fan system, or fans in an individual node or group of nodes. However, compact chassis form factors and high component density leaves only limited space for airflow. As the density of heat generating components increases, therefore, air cooling solutions are becoming more complicated and costly.

In recent years, liquid cooling has been proposed as an alternative to conventional forced-air convection cooling. Liquid-cooled structures have been shown, in some circumstances such as large data centers, to be more effective at cooling on a per-energy-unit basis. However, current liquid-cooled systems tend to have a higher initial cost and level of design complexity relative to air-cooled systems. Therefore, existing liquid-cooled system can be cost-prohibitive in some installations.

BRIEF SUMMARY

One embodiment of the present invention provides a cooling system for a memory module having a plurality of memory chips secured to opposing faces of a circuit board and a card edge having a plurality of electrical contacts connected to the memory chips. The cooling system includes a heat conduction assembly having opposing first and second supports, first and second heat spreader plates each extending from the first support to the second support along opposing faces of the memory module, and a pair of flattened heat pipes each extending in thermal communication along a respective one of the heat spreader plates from the first support to the second support. The cooling system further includes first and second liquid-cooled mounting blocks configured for releasably securing the supports and supporting the heat conduction assembly over a memory module socket into which the card edge of the memory module has been inserted, wherein the ends of the heat pipes are in thermal communication with the liquid-cooled mounting blocks.

Another embodiment of the invention provides a liquid-cooled memory module system. The dual in-line memory module (DIMM) sockets in a bank are each configured to removably receive a DIMM. Each DIMM has a plurality of memory chips secured to opposing faces of a circuit board. A plurality of heat conduction assemblies equal in number to the DIMM sockets each include opposing first and second supports. First and second heat spreader plates each extend from the first support to the second support and are positioned along opposing faces of the memory module with the memory chips in thermal engagement with the heat spreader plates. First and second flattened heat pipes each extend in thermal communication along a respective one of the heat spreader plates from the first support to the second support. First and second liquid-cooled mounting blocks are configured for releasably securing the supports and supporting the heat conduction assembly over a DIMM socket into which the card edge of the memory module has been inserted. The ends of the heat pipes are in thermal communication with the liquid-cooled mounting blocks.

DETAILED DESCRIPTION

A system for liquid-cooling memory modules is disclosed that allows memory modules to be easily serviced by a customer or field technician, and which easily fits within existing narrow chassis dimensions. The disclosed principles may be applied for cooling any current or subsequently developed type of memory module having memory chips mounted on a circuit board. By way of example, the memory modules to be cooled in the disclosed embodiment are standard dual in-line memory modules (DIMMs) having a plurality of dual random access memory (DRAM) chips. The cooling system includes a pair of liquid-cooled mounting blocks positioned adjacent to ends of an array or bank of parallel DIMMs. A separate heat conduction assembly is provided for each DIMM to conduct heat from each DIMM to the mounting blocks. The heat conduction assemblies are secured at the ends to the mounting blocks. Each heat conduction assembly includes parallel heat spreader plates that sandwich the respective DIMM, with the heat spreader plates in thermal engagement with the DRAM chips on each side of the DIMM. Each heat conduction assembly may also include a flattened heat pipe extending along each heat spreader plate to the mounting blocks. Chilled coolant is continuously circulated through the mounting blocks, which cools the heat conduction assemblies at both ends to enable transfer of heat from the DIMMs to the mounting blocks through the heat conduction assemblies.

A number of features are disclosed which maximize serviceability of memory system components, while minimizing any effect on chassis or system board dimensions. The location of the liquid-cooled mounting blocks adjacent to the ends of the DIMMs allows the DIMMs to be easily removed and replaced. There are also no liquid manifolds or other fluid control components above the DIMMs to interfere with removal and replacement of DIMMs. Also, the height of the mounting blocks with respect to a system board does not extend appreciably above the DIMMs, and no additional space is required above the DIMMs. Cooling system components also fit within existing space provided for a standard bank of DIMMs. Thus, conventional chassis dimensions may be unaffected by the presence of the cooling system components. The cooling system may be installed in a chassis as small as a 1 U server chassis, for example. Finally, a heat pipe provides a thermal conduction path between the DIMMs and the liquid-cooled mounting blocks. This greatly increases the heat transfer efficiency of the system.

Figure 1:
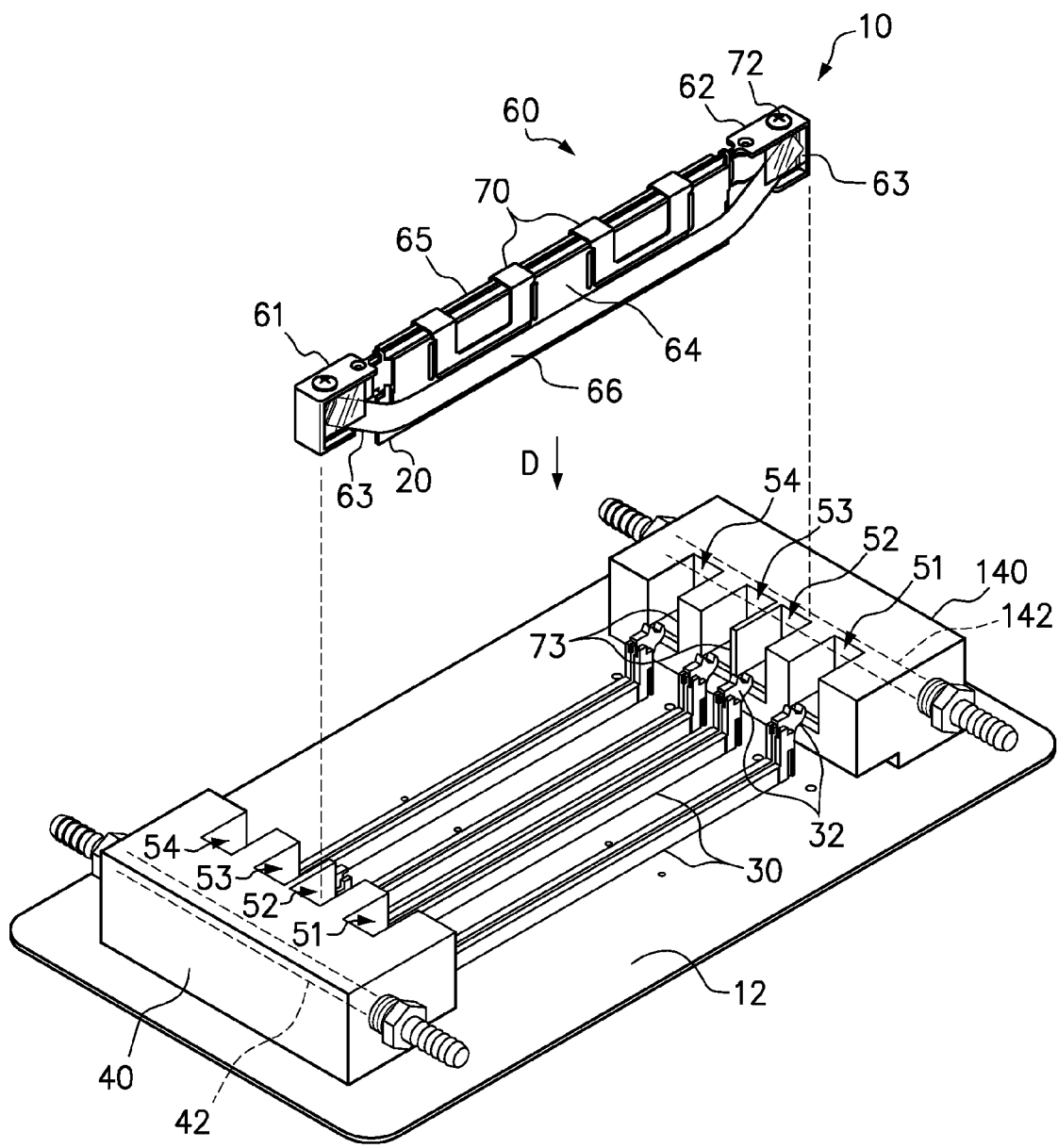
FIG. 1 is a perspective view of a disclosed liquid-cooled memory system.

FIG. 1 is a perspective view of a disclosed liquid-cooled memory system 10. A memory system, generally, may include any number of DIMMs and an equal number of DIMM sockets, each receiving one DIMM. The memory system 10 in this example comprises four DIMM sockets 30 on a system board 12 for receiving a total of four DIMMs 20 (further discussed in reference to FIG. 2). Cooling system components are designed to work with standard DIMM sockets 30, which include release latches 32 operable by hand to selectively release the DIMMs 20 from the DIMM sockets 30. Only one DIMM 20 is shown in FIG. 1, for simplicity of illustration, as the memory system 10 may use identical DIMMs 20, each having the same physical dimensions and memory capacity. The total system memory is a product of the number of DIMMs 20 and the individual memory capacity of each DIMM 20. The DIMMs 20 consume electrical energy and generate heat.

As an overview, the cooling system components includes a first liquid-cooled mounting block 40 disposed along a first end of the DIMM sockets 30, a second liquid-cooled mounting block 140 disposed along a second, opposing end of the DIMM sockets 30, and a separate heat conduction assembly 60 for each DIMM 20 to thermally bridge the first and second liquid-cooled mounting blocks 40, 140. Each heat conduction assembly 60 is supportable from its ends in corresponding slots 51-54 of the liquid-cooled mounting blocks 40, 140. In this example, the illustrated DIMM 20 is aligned for insertion into a third pair of slots 53. Each heat conduction assembly 60 thereby conducts heat from the respective DIMM 20 to the liquid-cooled mounting blocks 40, 140 for continuously cooling the DIMMs 20. As illustrated in FIG. 1, the heat conduction assembly may be pre-assembled on the DIMM 20, such that the DIMM 20 may be inserted into the DIMM socket 30 simultaneously with positioning the ends of the heat conduction assembly in the corresponding slots 51-54.

The heat conduction assembly 60 includes a first support 61 and a second support 62 at opposite ends of the assembly. The first and second supports are shown as separate members in this embodiment coupled to opposing ends of the DIMM 20. A first heat spreader plate 64 extends from the first support 61 to the second support 62. A second heat spreader plate 65 (partially hidden from view) is also parallel to the first heat spreader plate 64, on an opposing side of the DIMM 20, and extends from the first support 61 to the second support 62. A spacing between the heat spreader plates 64, 65 may be approximately equal to or slightly less than a thickness of the DIMM 20, so that the heat spreader plates 64, 65 frictionally engage the DIMM 20. The heat conduction assembly 60 optionally includes a pair of flattened heat pipes 66. Although one heat pipe is hidden from view in FIG. 1, the two heat pipes 66 on either side of the heat conduction assembly 60 may be similar or identical. Each heat pipe 66 extends along a respective one of the heat spreader plates 64, 65 from the first support 61 to the second support 62. The flattened heat pipes 66 may be hollow structures sealed at their ends, each containing a working fluid.

The optional heat pipes 66 are sealed systems in which the working fluid is contained, and the working fluid in the sealed heat pipes is not to be confused with the chilled liquid coolant supplied to the mounting blocks 40, 140. The working fluid may be in a mixed phase of liquid and vapor. The liquid phase of the working fluid evaporates at one or more hotter surfaces of the heat pipes 66, then moves and condenses on one or more cooler surfaces of the heat pipes 66. More particularly, the hotter surfaces at which the working fluid vaporizes are typically near the heat spreader plates 64, 65, as heated by the DIMM 20. The cooler surfaces at which the vaporized working fluid condenses are typically closer to the ends of the heat pipes 66, where the heat conduction assembly 60 contacts the liquid-cooled mounting blocks 40, 140. Thus, the general path of heat conduction through the heat conduction assembly 60 from the DIMM 20 to the mounting blocks 40, 140 is increased by the cycle of vaporization and condensation within the heat pipes 66. This mass transport may be further facilitated by upturned ends of the heat pipe, such that the upturned ends form a vapor space and any vapor condensing in the upturned end will flow back toward the center portion of the heat pipe. However, the heat pipes 66 are smaller than most or all production heat pipes, and may be as thin as 1.0 mm. The vapor space is correspondingly very small, which allows the heat pipes 66 to perform well at any orientation.

The two mounting blocks 40, 140 may be identical and/or include similar features, wherein like features are identified with like reference numerals. Each mounting block 40, 140 includes one or more liquid flow passages 42, through which liquid is circulated to continuously cool the mounting blocks 40, 140. The liquid flow passages 42 may pass straight through the blocks 40, 140, as shown, to effectively cool the mounting blocks 40, 140. An alternative flow path may also be used to increase the surface area between the flowing liquid and the mounting blocks, such as a serpentine flow path. This liquid is preferably chilled and circulates between the mounting blocks and a chiller (not shown). The plurality of slots (four slots 51, 52, 53, 54 in this embodiment) on each mounting block 40, 140 are equal in number to, and aligned with, the DIMM sockets 30. The slots 51-54 thermally engage, for example frictionally receive, the supports 61, 62 of the heat conduction assemblies 60. Thus, the first slot 51 on the first mounting block 40 aligns with the first slot 51 on the second mounting block 140, and so forth. The slots also precisely position each heat conduction assemblies 60 above one of the DIMM sockets 30. The slots or a portion of each slot is cooled by virtue of the coolant circulating through the mounting blocks 40, 140. Each heat conduction assembly 60 is supportable on the mounting blocks 40, 140, with the first support 61 of the heat conduction assembly 60 recessed into one of the slots 51-54 on the first mounting block 40 and with a second support 62 of the heat conduction assembly 60 positioned in the corresponding slot 51-54 on the second mounting block 140. Each heat conduction assembly 60 is thereby secured above the system board 12 and directly over a respective one of the DIMM sockets 30 when secured to the mounting blocks 40, 140.

Friction between the supports 61, 62 and the slots 51-54 may be sufficient to retain the heat conduction assemblies 60 in any conceivable orientation of the system board 10. The friction is preferably sufficient to keep the heat conduction assemblies 60 secured to the mounting blocks 40, 140 despite any range of vibration of movement encountered during use. Threaded fasteners 72 are optionally provided to releasably secure the heat conduction assembly 60 to the mounting blocks 40, 140 at either support. The threaded fasteners 72 threadedly engage threaded holes 73 on the mounting blocks 40, 140. If the optional heat pipes 66 are included, as illustrated, then the heat pipes are placed in direct thermal engagement with the mounting blocks 40, 140 to maximize heat transfer from the heat pipes 66 to the mounting blocks 40, 140. Alternatively, if the heat pipes 66 are omitted, the slots 51-54 and supports 61, 62 are sized so that supports 61, 62, and preferably the ends of the heat spreader plates 64, 65 that are received within the slots 51-54, are in direct thermal engagement with the mounting blocks 40, 140, for effective heat transfer from the heat conduction assemblies to the mounting blocks 40, 140.

Memory system and cooling system components may be installed in a variety of different ways according to the schematic diagram of FIG. 1. In one installation method, the DIMMs 20 are all installed in their respective DIMM sockets 30 by sliding the DIMMs 20 downward into the DIMM sockets 30 in an insertion direction "D." Then, each heat conduction assembly 60 is individually slid down over the respective DIMM 20, also in the insertion direction D. The DIMM 20 is frictionally received between the heat spreader plates 64, 65, and the supports 61, 62 are simultaneously slid into the respective slots on the liquid-cooled mounting blocks 40, 140. Sliding the supports 61, 62 into the slots urges the heat pipes 66 into frictional, thermal engagement with the mounting blocks 40, 140 within the slots 51-54 (optionally with a thin layer of TIM between the heat pipes 66 and the slots), to ensure reliable heat conduction between the heat conduction assemblies 60 and the mounting blocks 40, 140. Then, each DIMM 20 may be subsequently serviced by removing the optional heat conduction assembly 60 and then sliding the DIMM 20 out of its DIMM socket 30.

A thermal interface material (TIM) 63 may also be applied at the supports 61, 62. The TIM 63 is a thermally conductive material that may be applied to increase thermal conductance between two adjacent solid surfaces. Here, the TIM 63 is applied to increase thermal transfer efficiency between one of the ends 61, 62 of the heat conduction assembly 60 and one of the slots of the liquid-cooled mounting blocks (FIG. 1). The TIM 63 helps fill any gaps that may be present at this location, since air is a very poor conductor. One common TIM is a white-colored paste or thermal grease, such as silicone oil filled with aluminum oxide, zinc oxide, or boron nitride. An example of a suitable commercially-available thermal grease is the Shin-Etsu X23-7783D Thermal Compound. However, a gap pad, such as the commercially-available Bergquist Gap Pad 2500, is preferred because it is generally less messy when performing reworks.

Figure 2:
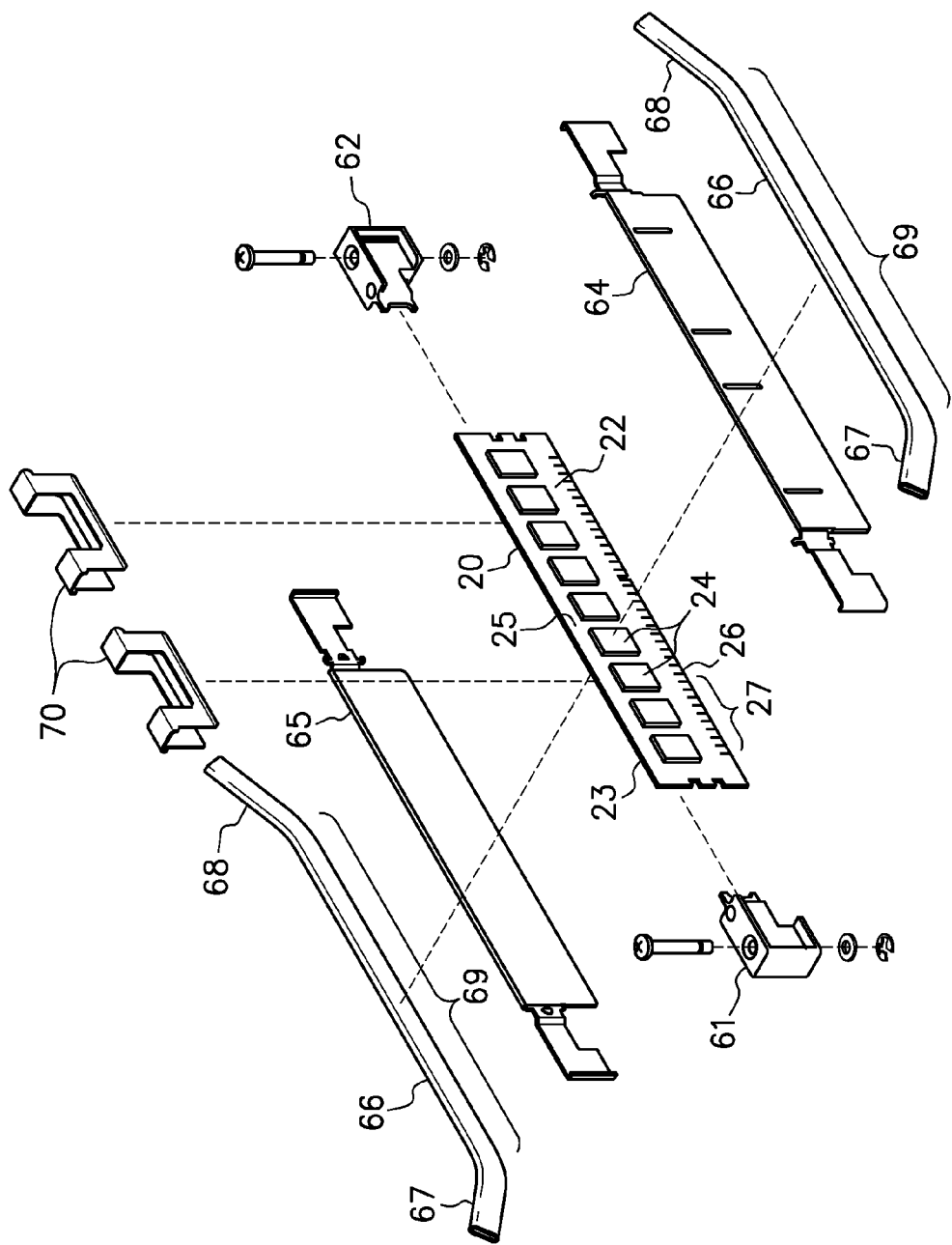
FIG. 2 is an exploded view of one heat conduction assembly and one DIMM 20.

FIG. 2 is an exploded view of one heat conduction assembly 60 and one DIMM 20. The DIMM 20 includes a DIMM circuit board 22, which may comprise electronic communication pathways such as etched circuit board traces. A plurality of DRAM chips 24 are provided on opposing faces 23, 25 of the DIMM circuit board 22. The DIMM circuit board 22 includes a card edge connector 26 having a plurality of pins or electrical contacts 27 connected to the DRAM chips 24 along electrical pathways. Components of the computer system may access the DIMMs 20 and specifically the DRAM chips 24 via the DIMM sockets 30 (FIG. 1). The cooling components of the liquid-cooled memory system 10 are capable of cooling standard DIMMs 20 arranged in a standard or otherwise typical DIMM layout on the system board 12, so that no modifications to the standard DIMMs 20 or DIMM sockets 30 are necessary.

The heat spreader plates 64, 65 may be welded or brazed onto the frame at the supports 61, 62. Alternatively, the heat spreader plates 64, 65 may simply be clamped into position using spring clips 70. The DIMM 20 is disposed between the heat spreader plates 64, 65, with the DRAM chips 24 in thermal engagement with the heat spreader plates 64, 65. The heat spreader plates 64, 65 may also be flexibly attached to the supports 61, 62 using a flexible attachment structure, such as flexible metallic ends of the heat spreader plates 64, 65, to bias the heat spreader plates 64, 65 against the opposing faces 23, 25 of the DIMM 20 when the DIMM 20 is received between the plates 64, 65. Alternatively, the heat spreader plates 64, 65 may initially be positioned loosely against the opposing faces 23, 25 of the DIMM 20 and then urged into thermal engagement with the DRAM chips 24 using the spring clips 70.

One end 67 of the heat pipe 66 is secured to the first support 61 of the heat conduction assembly 60 and the other end 68 of the heat pipe 66 is secured to the second support 62 of the heat conduction assembly 60. The ends 67, 68 of the heat pipe 66 are closed, and may be in direct contact with the slots on the blocks 40, 140 of FIG. 1. The flat heat pipes 66 facilitate greater surface area for contacting the mounting blocks and reduce the overall thickness of the heat conduction assembly to fit within the gaps between adjacent DIMMs. The heat pipes 66 may be extraordinarily thin. In forming the heat pipe 66, an initially 6.0 mm diameter (round) section of pipe stock may be flattened to a thickness of only 1.0 mm.

The heat pipe 66 follows a generally "U-shaped" path, curving downwardly from either end 67, 68 to a straight section 69 that runs along a lower edge of the respective heat spreader plate 65. This U-shaped path provides additional clearance for the spring clips 70 to slide down over the heat spreader plates 64, 65. Additionally, the U-shaped path of the heat pipe 60 positions the straight section 69 at a lower end of the DRAM chips on the DIMM 20 (see FIG. 1) to conduct heat away from the DRAM chips to the ends 67, 68 of the heat pipe 66. The heat pipe 66 is still slightly above the card edge 26 of the DIMM 20, to allow the card edge 26 to be inserted into the DIMM socket 30 (see FIG. 1). Another feature associated with having the heat pipe 66 positioned just below the spring clips 70 is that the spring clips 70 and the heat pipe 66 do not overlap, which reduces the overall width of the heat conduction assembly 60. In one embodiment, the overall width of the heat conduction assembly 60 is less than or equal to the width of the DIMM socket 30 (FIG. 1) positioned below the heat conduction assembly 60, so that the cooling system components may be used with a memory system having standard DIMMs 20 and a pre-established spacing between DIMM sockets 30.

Figure 3:
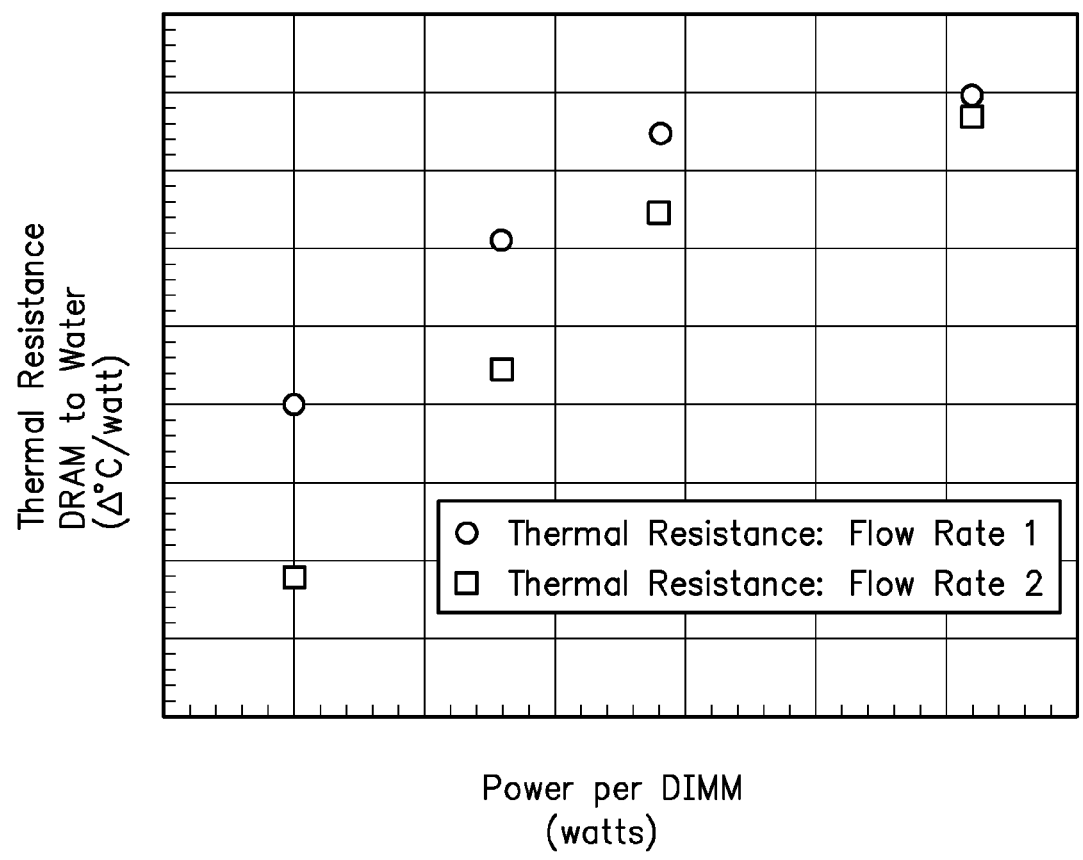
FIG. 3 is a graph illustrating the favorable heat conduction properties of a prototype of the heat conduction assembly of FIG. 2.

FIG. 3 is a graph illustrating the favorable heat conduction properties of a prototype of the heat conduction assembly of FIG. 2. The graph plots the Thermal Resistance (vertical axis) versus the Power per DIMM (horizontal axis), showing how the thermal resistance of the proposed cooling system varies with the power per DIMM for two different volumetric flow rates (Flow Rates 1 and 2). As expected, the thermal resistance increases with an increase in power per DIMM. Thus, Flow Rate 2 is higher than Flow Rate 1. This illustrates that the overall thermal resistance is reduced with higher flow rates and low per DIMM power states. System cooling parameters may be optimized to "tune" this cooling system to a specific application.

Figure 4:
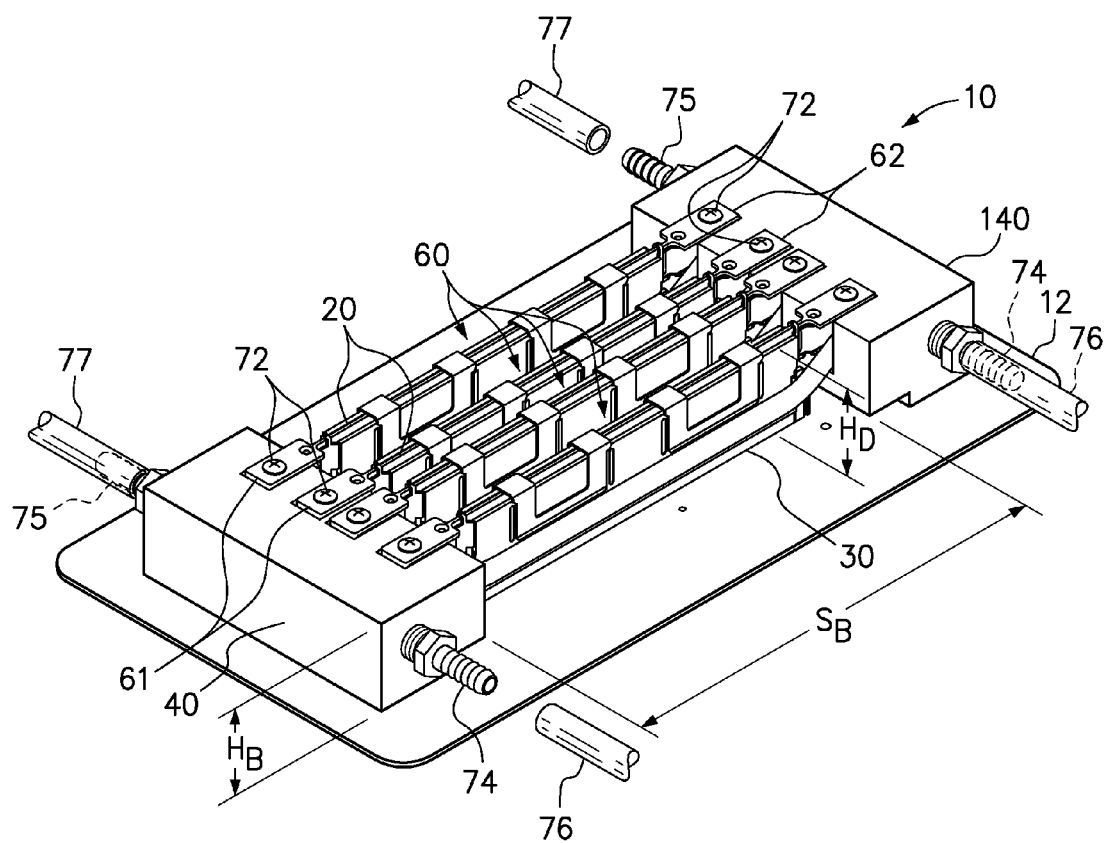
FIG. 4 is a schematic diagram of the liquid-cooled memory system with all four DIMMs installed and with the heat conduction assemblies in position about the four DIMMs.

FIG. 4 is a schematic diagram of the liquid-cooled memory system 10 with four DIMMs 20 installed and with four heat conduction assemblies 60 installed about the four DIMMs 20. Each of the four heat conduction assemblies 60 has the first and second supports 61, 62 secured within the respective slots on the liquid-cooled mounting blocks 40, 140, and secured to the blocks 40, 140 using the threaded fasteners 72. Chilled coolant may be circulated to the mounting blocks 40, 140 in any of a variety of conventional manners. By way of example, each mounting block 40, 140 in this embodiment is equipped with a fluid inlet coupler 74 to which an inlet hose 76 may be connected and a fluid outlet coupler 75 to which an outlet hose 77 may be connected. By way of illustration, the hoses 76, 77 are shown disconnected from the coupler 74, 75 on the first block 40 and connected, such as by sliding, to the couplers 74, 75 on the second block 140. Chilled liquid coolant may be supplied to the liquid-cooled mounting blocks 40, 140 by the inlet hoses 76. The liquid-cooled mounting blocks 40, 140 serve as a heat exchanger that absorbs the heat from the DIMMs 20. The liquid coolant is heated as it passes through the mounting blocks 40, 140. Heated coolant may be discharged from the liquid-cooled mounting blocks 40, 140 at the outlet hoses 77 and pass through a chiller before being re-supplied to the liquid-cooled mounting blocks 40, 140. The circulation of chilled coolant to the liquid-cooled mounting blocks 40, 140 continuously chills the liquid-cooled mounting blocks and keeps the supports 61, 62 of the heat conduction assemblies 60 cool, so that heat is continuously conducted away from the DIMMs 20. It should be recognized that the direction of fluid flow through the two mounting blocks may be the same (as shown) or different.

Some conventional cooling systems include liquid flow components positioned above the DIMMs to be cooled, thus increasing a chassis height (in a direction perpendicular to the system board 12). The liquid-cooled memory system 10 in FIG. 2, by contrast, provides the liquid-cooled mounting blocks 40, 140 near the opposing ends of the DIMMs 20 and DIMM sockets 30. The heat conduction assemblies 60 thereby draw heat from the DIMMs 20 in a horizontal direction, generally parallel to the system board 12, to the liquid-cooled mounting blocks 40, 140. The liquid-cooled mounting blocks 40, 140 are parallel to one another, and are positioned at least slightly outwardly from the bank of DIMMs 20, such that a spacing $S_B$ between the liquid-cooled mounting blocks 40, 140 does not interfere with installation and removal of the DIMMs, such as where $S_B$ is at least slightly greater than a length of the DIMMs 20 and DIMM sockets 30. This spacing between the liquid-cooled mounting blocks 40, 140 and lack of any cooling manifolds or other fixed components above the DIMMs 20 ensures that the heat conduction assemblies 60 and the DIMMs 20 may be removed without obstruction when lifted upward, generally perpendicular to the system board 12. Also, it is preferable that no part of the liquid-cooled mounting blocks 40, 140 intersect a footprint of the DIMM sockets 30 as orthogonally projected from the system board 12. Thus, the liquid-cooled mounting blocks 40, 140 do not interfere with removal of the heat conduction assemblies 60 and then the DIMMs 20.

The height of the liquid-cooled mounting blocks 40, 140 with respect to the system board 12 is labeled in FIG. 4 as $H_B$. The installed height of the DIMM 20, i.e. distance between the upper edge 22 and the system board 12 is labeled in FIG. 4 as $H_D$. The block height $H_B$ is preferably equal to (or no greater than) the DIMM height $H_D$. That is, it is preferably that the liquid-cooled mounting blocks 40, 140 do not extend above the upper edge 22 of the DIMMs 20 when the DIMMs 20 are fully inserted into the DIMM sockets 30. Although the height $H_B$ may rise slightly above the top of the installed DIMM, it is important that the mounting blocks do not extend beyond the chassis dimensions or interfere with air flow that is responsible for cooling other chassis components. Accordingly, limitations on the height $H_B$ of the liquid-cooled mounting blocks 40, 140 are not arbitrarily selected. Rather, it is preferably that the block height $H_B$ is no greater than the DIMM height $H_D$ so as to ensure that the cooling system 10 is compatible with existing chassis dimensions for a chassis in which the system board 12 is installed. This limitation on the block height $H_B$ is made possible, in part, because the liquid-cooled mounting blocks 40, 140 are positioned at least slightly outwardly from the bank of DIMMs 20, with no part of the liquid-cooled mounting blocks 40, 140 extending over or above the DIMMs 20. Additionally, there are no fixed components of the cooling assembly 10 above the DIMMs 20 to interfere with removal of the heat conduction assemblies 60 and the DIMMs 20. Accordingly, the memory system components may be easily serviceable as in many conventional, air-cooled memory systems.

The materials used in the cooling system may comprise common metals and metal alloys having favorable heat conduction properties. For example, the liquid-cooled mounting blocks are preferably formed from aluminum blocks, which have good heat transfer and heat dissipation properties, combined with relatively low material cost and light weight. The frame of the heat-conduction assemblies may also be formed from aluminum, which also has low weight for facilitating easy installation and removal of the heat conduction assemblies. The heat pipes may be formed from copper, which also has a high thermal conductivity as well as good corrosion resistance for reliably containing the working fluid. The heat spreader plates may also be formed of either aluminum or copper. Other materials having good heat conduction properties may be substituted for aluminum or copper.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A cooling system for a memory module having a plurality of memory chips secured to opposing faces of a circuit board and a card edge having a plurality of electrical contacts connected to the memory chips, the cooling system comprising:
   a heat conduction assembly including opposing first and second supports and first and second heat spreader plates each extending from the first support to the second support along opposing faces of the memory module;
   first and second liquid-cooled mounting blocks configured for releasably securing the supports and supporting the heat conduction assembly over a memory module socket into which the card edge of the memory module has been inserted, wherein the supports of the heat conduction assembly are in thermal engagement with the liquid-cooled mounting blocks, and wherein the first and second liquid-cooled mounting blocks each comprise one or more liquid flow passages; and
   a pair of flattened heat pipes included with the heat conduction assembly, each heat pipe extending in thermal communication along a respective one of the heat spreader plates from the first support to the second support, wherein the heat pipes are in thermal engagement with the liquid-cooled mounting blocks when the supports are secured on the liquid-cooled mounting blocks.

2. The cooling system of claim 1, wherein the liquid-cooled mounting blocks comprise:
   a first slot on the first liquid-cooled mounting block configured to frictionally receive the first support and urge the heat pipes into frictional, thermal engagement with the first mounting block, and a second slot on the second liquid-cooled mounting block configured to frictionally receive the second support and urge the heat pipes into frictional, thermal engagement with the second mounting block.

3. The cooling system of claim 2, wherein the friction between the supports and the slots is sufficient to retain the heat conduction assemblies on the mounting blocks at any position of a computer system.

4. The cooling system of claim 1, wherein the flattened heat pipes have a thickness of no greater than 1.0 mm.

5. The cooling system of claim 1, wherein a spacing between the liquid-cooled mounting blocks is greater than a length of the memory module.

6. The cooling system of claim 1, wherein the liquid-cooled mounting blocks do not extend above an upper edge of the memory module when the memory module is received in an installed position within the memory module socket.

7. The cooling system of claim 1, wherein no part of the liquid-cooled mounting blocks projects over the top of the memory module socket.

8. The cooling system of claim 1, further comprising:
   a spring clip removably positionable on the first and second heat spreader plates to bias the heat spreader plates into thermal contact with the plurality of memory chips on the memory module.

9. The cooling system of claim 1, wherein the heat pipes have a generally U-shaped path that dips downward from a location of attachment to the supports.

10. A liquid-cooled memory module system, comprising:
   a bank of dual in-line memory module (DIMM) sockets, each socket being configured to removably receive a DIMM, and each DIMM having a plurality of memory chips secured to opposing faces of a circuit board;
   a plurality of heat conduction assemblies equal in number to the DIMM sockets, each heat conduction assembly including opposing first and second supports, first and second heat spreader plates each extending from the first support to the second support and positioned along opposing faces of the memory module with the memory chips in thermal engagement with the heat spreader plates, and a pair of flattened heat pipes each extending in thermal communication along a respective one of the heat spreader plates from the first support to the second support; and
   first and second liquid-cooled mounting blocks configured for releasably securing the supports and supporting the heat conduction assembly over a DIMM socket into which the card edge of the memory module has been inserted, wherein the ends of the heat pipes are in thermal communication with the liquid-cooled mounting blocks.

11. The liquid-cooled memory module system of claim 10, further comprising:
   one or more liquid flow passages through each of the liquid-cooled mounting blocks; and
   a chilled liquid coolant source in fluid communication with the liquid flow passages and configured for flowing coolant through the liquid flow passages.

12. The liquid-cooled memory module system of claim 10, wherein the liquid-cooled mounting blocks comprise:
   a plurality of slots on the first liquid-cooled mounting block each configured to frictionally receive the first support of the respective frame to urge the heat pipes into frictional, thermal engagement with a chilled portion of the first mounting block, and a second plurality of slots on the second liquid-cooled mounting block in one-to-one correspondence and aligned with the first plurality of slots, each configured to receive the second support of the frame to urge the heat pipes into frictional, thermal engagement with a chilled portion of the second mounting block.

13. The liquid-cooled memory module system of claim 12, wherein the friction between the supports and the slots is sufficient to retain the heat conduction assemblies on the mounting blocks at any position of a computer system.

14. The liquid-cooled memory module system of claim 10, wherein a spacing between the liquid-cooled mounting blocks is greater than a length of the memory modules.

15. The liquid-cooled memory module system of claim 10, wherein the liquid-cooled mounting blocks do not extend above an upper edge of the memory modules when the memory modules are received within the DIMM sockets.

16. The liquid-cooled memory module system of claim 10, wherein no part of the liquid-cooled mounting blocks projects over the DIMM sockets.

17. The liquid-cooled memory module system of claim 10, wherein the flattened heat pipes have a thickness of no greater than 1.0 mm.

18. The liquid-cooled memory module system of claim 10, further comprising:
   spring clips removably positionable on the first and second heat spreader plates and biased to urge the heat spreader plates into thermal engagement with the plurality of memory chips on the memory module.

19. The liquid-cooled memory module system of claim 10, wherein the heat pipes have a generally U-shaped path that dips downward from a location of attachment to the supports.

* * * * *